United States Patent
Palit et al.

(10) Patent No.: US 9,337,233 B1
(45) Date of Patent: May 10, 2016

(54) PHOTODIODE ARRAY FOR IMAGING APPLICATIONS

(71) Applicant: GENERAL ELECTRIC COMPANY, Schenectady, NY (US)

(72) Inventors: Sabarni Palit, Guilderland, NY (US); James Wilson Rose, Guilderland, NY (US); Peter Micah Sandvik, Niskayuna, NY (US); Jonathan David Short, Saratoga Springs, NY (US); Ching-Yeu Wei, Schenectady, NY (US); Xingguang Zhu, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/570,089

(22) Filed: Dec. 15, 2014

(51) Int. Cl.
H01L 31/062 (2012.01)
H01L 31/113 (2006.01)
H01L 27/146 (2006.01)

(52) U.S. Cl.
CPC ...... *H01L 27/14663* (2013.01); *H01L 27/1464* (2013.01); *H01L 27/14643* (2013.01)

(58) Field of Classification Search
CPC .............. G01T 1/20; G01T 1/24; H05G 1/60; H01L 21/3141; H01L 27/14643; H01L 27/11898; H01L 27/0814; H01L 27/0922; H01L 29/6603; H01L 29/7869
USPC ......... 257/288, 292, 290, 293, 294, 186, 431, 257/432, 442, E21.053, E21.126, E21.127, 257/E21.189, E21.253, E21.266, E21.267, 257/E21.278, E21.293, E21.32, E21.352, 257/E21.499, E21.527, E21.617, E21.632
See application file for complete search history.

(56) References Cited

U.S. PATENT DOCUMENTS

| | | | | |
|---|---|---|---|---|
| 5,079,426 A | * | 1/1992 | Antonuk | A61B 6/032 250/370.09 |
| 6,331,438 B1 | * | 12/2001 | Aylott | G01N 21/66 436/172 |
| 6,426,991 B1 | | 7/2002 | Mattson et al. | |
| 6,917,664 B2 | | 7/2005 | Chappo et al. | |
| 7,403,589 B1 | * | 7/2008 | Short | A61B 6/032 378/19 |
| 7,652,257 B2 | * | 1/2010 | Li | G01T 1/2018 250/370.01 |
| 7,956,332 B2 | * | 6/2011 | Burr | G01T 1/20 250/361 R |
| 8,159,049 B2 | | 4/2012 | Hietanen | |
| 8,548,119 B2 | * | 10/2013 | Ikhlef | A61B 6/035 378/19 |
| 8,610,079 B2 | * | 12/2013 | Narayanaswamy | G01T 1/20 250/370.11 |
| 9,050,185 B2 | * | 6/2015 | Pugh | G02C 7/04 |
| 2013/0327947 A1 | | 12/2013 | Ronda et al. | |

FOREIGN PATENT DOCUMENTS

WO 2013045947 A1 4/2013

OTHER PUBLICATIONS

Altman et al., "Detector-Based Innovations in Medical Imaging (CT and PET)", Philips, pp. 1-12.
(Continued)

*Primary Examiner* — David Nhu
(74) *Attorney, Agent, or Firm* — Melissa K. Dobson

(57) ABSTRACT

Embodiments of a photodiode array are provided herein. In some embodiments, a photodiode array may include a semiconductor layer configured to convert photons into analog electrical signals; and a passive layer having a first surface and a second surface disposed opposite the first surface, wherein the semiconductor layer is coupled to the first surface, and wherein the passive layer is configured to have a signal receiving component coupled directly to the second surface of the passive layer.

15 Claims, 3 Drawing Sheets

(56) References Cited

OTHER PUBLICATIONS

Steadman et al., "A CMOS Photodiode Array With In-Pixel Data Acquisition System for Computed Tomography", IEEE Journal of Solid-State Circuits, pp. 1-10, vol. 39, Issue 7, Jul. 2004.

Ulzheimer et al., "Stellar Detector Performance in Computed Tomography", Siemens, Dec. 14, 2011.

Xu, "A Segmented Silicon Strip Detector for Photon-Counting Spectral Computed Tomography", Thesis, KTH Engineering Sciences, pp. 1-51, 2012.

* cited by examiner

PHOTODIODE ARRAY FOR IMAGING APPLICATIONS

BACKGROUND

The field of the disclosure relates generally to detectors for imaging systems, and more particularly, to a photodiode array.

Conventional photodiode arrays utilized in detector modules of imaging systems (e.g., medical imaging systems such as CT systems) typically include a complex integration of a number of components. For example, the detector module is typically constructed of multiple stacked optoelectronic and electronic components that are mechanically and/or electrically coupled to one another via various intervening layers and interconnects. However, the inventors have observed that the high number of components and/or layers required for such configurations result in a detector that is costly and suffers from reliability and yield issues due to the complexity. Moreover, as the number of components or layers increase, instances of mismatched rates of thermal expansion between components increases, thereby resulting in poor alignment of layers, thus further decreasing reliability and providing an unacceptable yield.

Therefore, the inventors have provided an improved photodiode array for imaging application.

BRIEF DESCRIPTION

Embodiments of a photodiode array are provided herein. In some embodiments, a photodiode array may include a semiconductor layer configured to convert photons into analog electrical signals; and a passive layer having a first surface and a second surface disposed opposite the first surface, wherein the semiconductor layer is coupled to the first surface, and wherein the passive layer is configured to have a signal receiving component coupled directly to the second surface of the passive layer.

In some embodiments, a radiation detector for an imaging apparatus may include a scintillator; a photodiode array, comprising: a backlit diode; a passive layer having a first surface and a second surface disposed opposite the first surface, wherein the backlit diode is coupled to the first surface; and a signal receiving component coupled to the second surface of the passive layer.

The foregoing and other features of embodiments of the present invention will be further understood with reference to the drawings and detailed description.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

Embodiments of a photodiode array are provided herein. In at least some embodiments, the inventive photodiode array reduces a number of components typically utilized in conventional photodiode array fabrication, thereby reducing fabrication cost and complexity of the photodiode array. Moreover, in at least some embodiments, the inventive photodiode array facilitates routing of analog signals from diode within the photodiode array, thereby providing a more compact, less complex and more cost effective integration possibilities of the photodiode array. In addition, in at least some embodiments, the inventive photodiode array facilitates the use of a semiconductor layer (e.g., diode) that is thinner as compared to conventionally utilized semiconductor layers, thereby enabling an improved performance of the photodiode array, for example, such as an improved temporal response, thermal response, less performance variation across pixels and less edge pixel leakage as compared to conventional photodiode arrays.

Embodiments discussed herein relate to detectors for use in imaging systems, for example, detectors used in X-ray based imaging modalities (e.g., fluoroscopy, mammography, computed tomography (CT), tomosynthesis, angiography, or the like), nuclear imaging systems (e.g., such as a positron emission tomography (PET) or single photon emission computed tomography (SPECT) imaging system or in a combined or hybrid imaging system including such PET or SPECT imaging functionality such as PET/MR, PET/CT, or SPECT/CT imaging system, or the like), magnetic imaging systems (Magnetic resonance imaging (MRI), nuclear magnetic resonance imaging (NMRI), or magnetic resonance tomography (MRT), or the like), or the like. It should be appreciated, however, that the present devices may also be employed in other types of imaging modalities or detectors, including non-medical applications for example packaging inspection systems. However, to simplify explanation, and to facilitate discussion in the context of a concrete example, the present discussion will be provided in the context of a CT imaging system.

Figure 1:
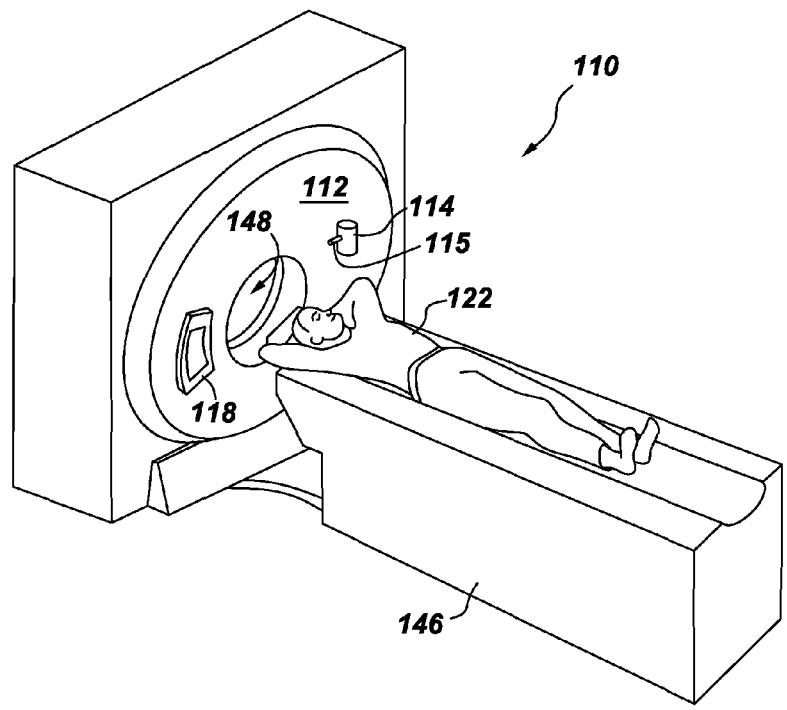
FIG. 1 is a pictorial view of an exemplary imaging system.
Figure 2:
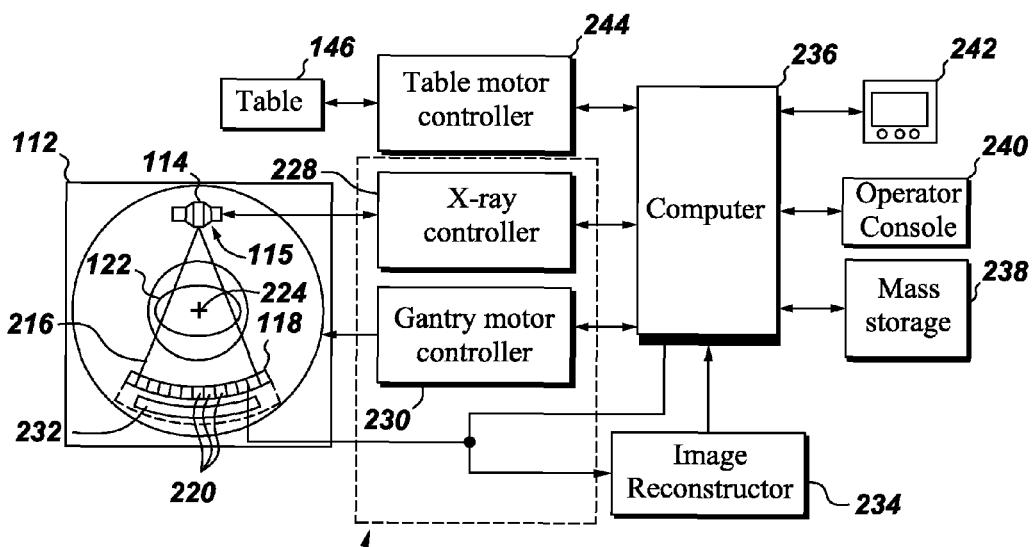
FIG. 2 is block schematic diagram of the exemplary system illustrated in FIG. 1.

Referring to FIGS. 1 and 2, in some embodiments, a computed tomography (CT) imaging system 110 may generally include a gantry 112 having an opening 148 and a table 146 configured to move a patient 122 through a gantry opening 148. The gantry 112 has an x-ray source 114 that projects a beam of x-rays from a focal spot 115 of the source 114 and toward a radiation detector 118 on the opposite side of the gantry 112.

Referring now to FIG. 2, the radiation detector 118 is formed by a plurality of detector modules 220 and a control and processing board 232 (i.e., electronics board). The plurality of detector modules 220 sense the projected x-rays 216 that pass through a patient 122, with the electronics board 232 performing subsequent processing on the acquired data. Each detector module 220 produces an output that represents the intensity of an impinging x-ray beam and hence the attenuated beam as it passes through the patient 122. During a scan to acquire x-ray projection data, gantry 112 and the components mounted thereon rotate about a center of rotation 224.

Rotation of gantry 112 and the operation of x-ray source 114 are governed by a control mechanism 226 of CT system 110. Control mechanism 226 includes an x-ray controller 228 that provides power and timing signals to an x-ray source 114 and a gantry motor controller 230 that controls the rotational speed and position of gantry 112. An image reconstructor 234 receives sampled and digitized x-ray data from electronics board 232 and performs high speed reconstruction. The reconstructed image is applied as an input to a computer 236 which stores the image in a mass storage device 238.

The computer 236 receives commands and scanning parameters from an operator via console 240 that has some form of operator interface, such as a keyboard, mouse, voice activated controller, or any other suitable input apparatus. An associated display 242 allows the operator to observe the reconstructed image and other data from the computer 236. The operator supplied commands and parameters are used by the computer 236 to provide control signals and information to the electronics board 232, x-ray controller 228, and gantry motor controller 230. In addition, the computer 236 operates a table motor controller 244 which controls the table 246 to position the patient 122 and gantry 112.

In some embodiments, the detector modules 220 generally include a plurality of sub-modules having an array of detector elements or pixels that are configured to receive x-rays attenuated through the object and convert the x-rays into analog electrical signals. The detector elements/pixels at least partially comprise a scintillator-photodiode pairing. In forming the scintillator-photodiode pair, a number of scintillator detector elements or pixels are arranged to form a scintillating pack array.

Figure 3:
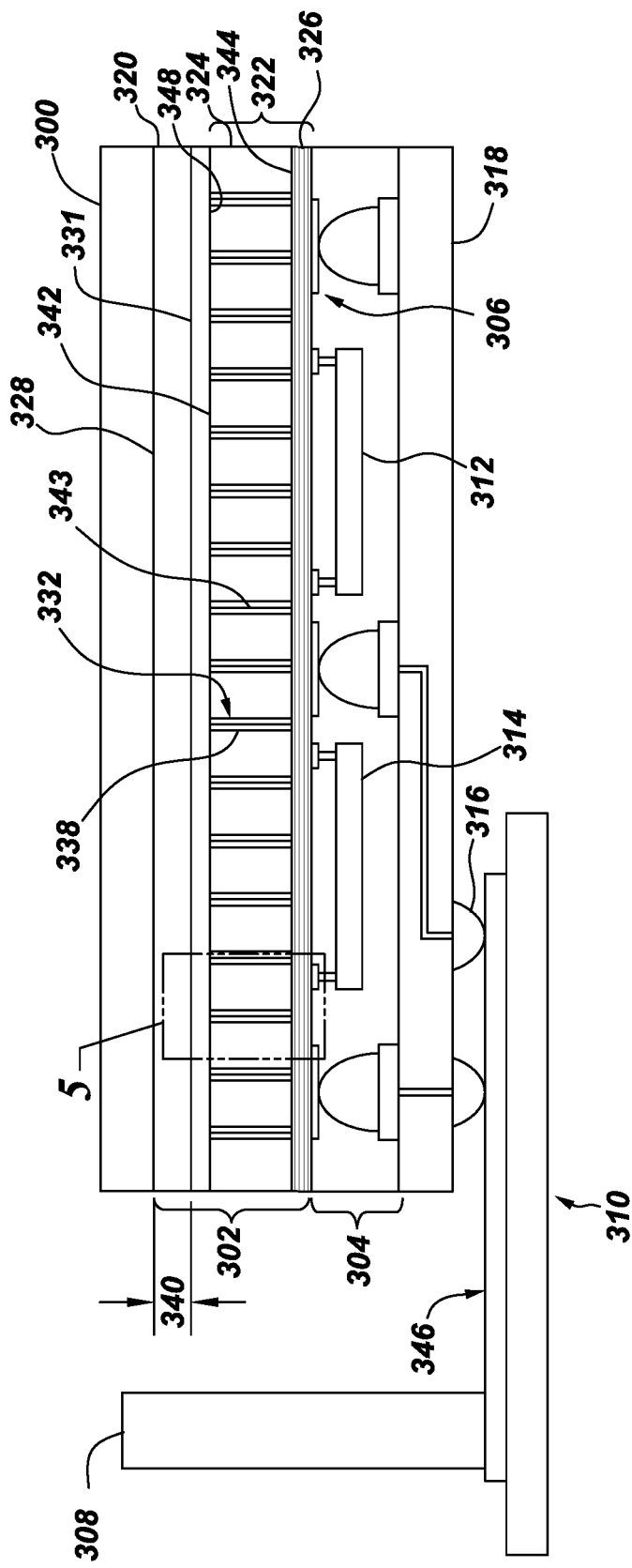
FIG. 3 is a schematic view of a portion of a photodiode array in accordance with some embodiments of the present invention.

For example, referring to FIG. 3, in some embodiments, the scintillating pack array (scintillator) 300 may be optically coupled to the photodiode array 302 and the photodiode array 302 is in turn coupled to one or more signal receiving components 304, for example, such as an application specific integrated circuit (ASIC) electronics package having one or more ASICs (two ASICs 312, 314 shown). When present, the ASIC electronics package is configured, in part, to perform analog-to-digital (A/D) conversion of signals received from photodiode array 302. That is, the ASIC electronics package functions to convert analog electrical signals received from photodiode array 302 into digital numbers based on a level of the signal received from the diode array. Thus, in the operation of one embodiment, x-rays impinge within the scintillator 302 to generate photons that are detected on a photodiode pixel/element within the photodiode array 302, with an analog signal generated by photodiode array 302 responsive thereto being received by ASIC electronics package for conversion to a digital signal/number.

In some embodiments, the signal receiving component 304 may be electrically and/or mechanically coupled to photodiode array 302 by way of one or more input/output (I/O) interconnect(s) 306 formed thereon. The I/O interconnect 306 may be formed as a ball grid array (BGA) type interconnect, for example, or another similar bonding device that electrically and mechanically couples the signal receiving components 304 to the photodiode array 302, such as conductive epoxy, stud bumps, copper pillar, thermosonic bonds, combinations thereof, or the like. In some embodiments, a substrate layer 318 is positioned beneath the signal receiving component 304. When present, the substrate layer 318 may be formed of an electrically insulating material and is configured to provide support/rigidity to the scintillator 300, photodiode array 302 and signal receiving component 304. Positioned beneath the substrate layer 318 is a flex circuit 310 attached to the signal receiving component 304 and configured to transmit signals from the signal receiving component 304 to the control and processing board 232 of the detector module 220 (FIGS. 1 and 2), and also transfers controls and power to/from the control and processing board 232. In some embodiments, the flex circuit 310 includes a connector/electrically bondable area 346 configured to interface with the signal receiving component 304 and a connector 308 configured to interface with control/processing board 232 of the radiation detector 118 (FIG. 2).

The photodiode array 302 generally comprises a semiconductor layer 320 and passive layer 322. The photodiode array 302 may be fabricated via any fabrication process suitable to form the photodiode array 302, for example, such as a diode specific or CMOS fabrication process.

The passive layer 322 generally comprises a first surface 348 and a second surface 344 disposed opposite the first surface 348. The first surface 348 is configured to facilitate coupling the semiconductor layer 320 to the passive layer 322 and the second surface configured to couple the signal receiving component 304 to the passive layer 322. The inventors have observed that providing the passive layer 322 as described herein facilities routing of signals (e.g., analog signals) from the scintillator 300/semiconductor layer 320 within the photodiode array 302, thereby reducing a number of components typically utilized in detector fabrication, thus enabling a more compact, simpler and more cost effective detector.

The passive layer generally comprises a bulk material (interposer layer) 324. The inventors have observed that the presence of the bulk material advantageously provides structural and/or mechanical support to the semiconductor layer 320, thereby allowing for a thinner (as compared to conventionally utilized semiconductor layers) semiconductor layer 320 to be utilized while improving thermal characteristics, durability, reliability and yield.

The interposer layer 324 may comprise any dielectric material, for example a silicon containing material such as a single crystal or poly-crystalline silicon (Si), silicon oxide ($SiO_2$), glass, or the like. The dielectric material may have a resistivity of, for example, between about 5 ohm-cm and 2000 ohm-cm. In some embodiments, the interposer layer 324 may be doped with a suitable p-type or n-type material. The bulk material may have any thickness suitable to provide the benefits described herein, for example, such as a thickness of about 50 micron to about 800 um.

In some embodiments, the interposer layer 324 comprises one or more features 332 extending from the first surface 348 to the second surface 344. The features 332 may be any suitable type of features, for example, trenches, vias (such as through silicon vias) or the like. When present, the one or more features 332 may be filled with a conductive material 342 to facilitate electrically coupling the semiconductor layer 320 to the signal receiving component 304. In some embodiments, an insulating or dielectric material 338 may be disposed within the features 332 and between the conductive material 342 and the interposer layer 324 to facilitate electrically isolating the conductive material 342 from the interposer layer 324.

In some embodiments, the passive layer 322 may further include a redistribution layer 326. When present, the redistribution layer 326 advantageously provides analog and/or digital routing and coupling of a signal provided by the semiconductor layer 320 via the interposer layer 324 to the signal receiving component 304 (e.g., anode 410, system I/O routing 412 and cathode 414 shown in FIGS. 4 and 5). In some embodiments, the redistribution layer 326 may comprise a plurality of alternating conductive layers and organic or inorganic dielectric layers (collectively indicated at 336). The redistribution layer 326 may be fabricated via any suitable process known in the art. For example, in some embodiments, the redistribution layer 326 may be fabricated during the photodiode array 302 fabrication process via the deposition of additional conductive or metal layers to form the alternating conductive layers and organic or inorganic dielectric layers 306. Fabricating the redistribution layer 326 in such a manner reduces overall process steps that would otherwise be required to fabricate the redistribution layer 326 separately, thereby making the overall fabrication process simpler and more cost efficient.

The semiconductor layer 320 may be any type of layer capable or configured to convert photons into analog electrical signals, for example, such as a backlit diode. In such embodiments, the semiconductor layer 320 may include a light receiving surface 328 and an opposing surface 331 configured to couple the semiconductor layer 320 to the passive layer 322. One or more conductive contacts 330 may facilitate an electrical coupling of the semiconductor layer 320 to the conductive material 342 disposed in the features 332 of the interposer layer 324.

As described above, the interposer layer 324 facilities a thinner semiconductor layer 320 (as compared to conventionally utilized semiconductor layers in imaging applications) to be utilized. For example, in some embodiments, the semiconductor layer 320 may have a thickness 340 of less than about 200 microns, or in some embodiments less than 50 microns, for example, such as 20 microns. The inventors observed that providing a thinner semiconductor layer 320 as described herein enables an improved performance of the photodiode array 302, for example, such as an improved temporal response, improved thermal characteristics, less performance variation across pixels and less edge pixel leakage as compared to conventional photodiode arrays.

Figure 4:
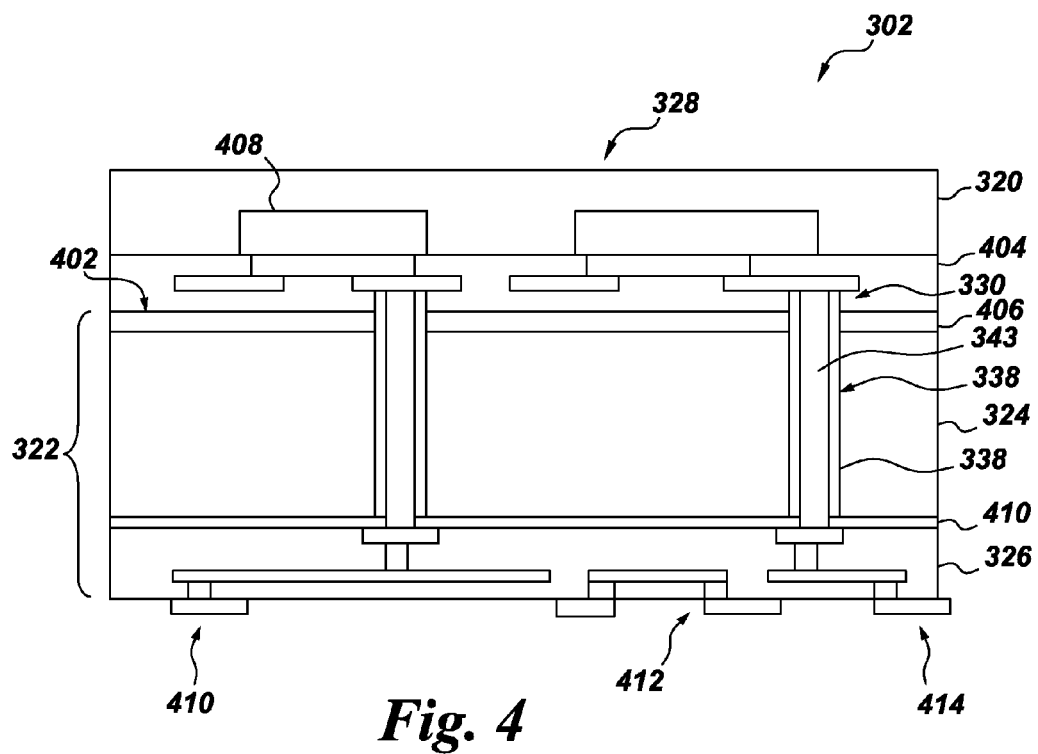
FIG. 4 is a partial view of a portion of the photodiode array shown in FIG. 3 in accordance with some embodiments of the present invention.
Figure 5:
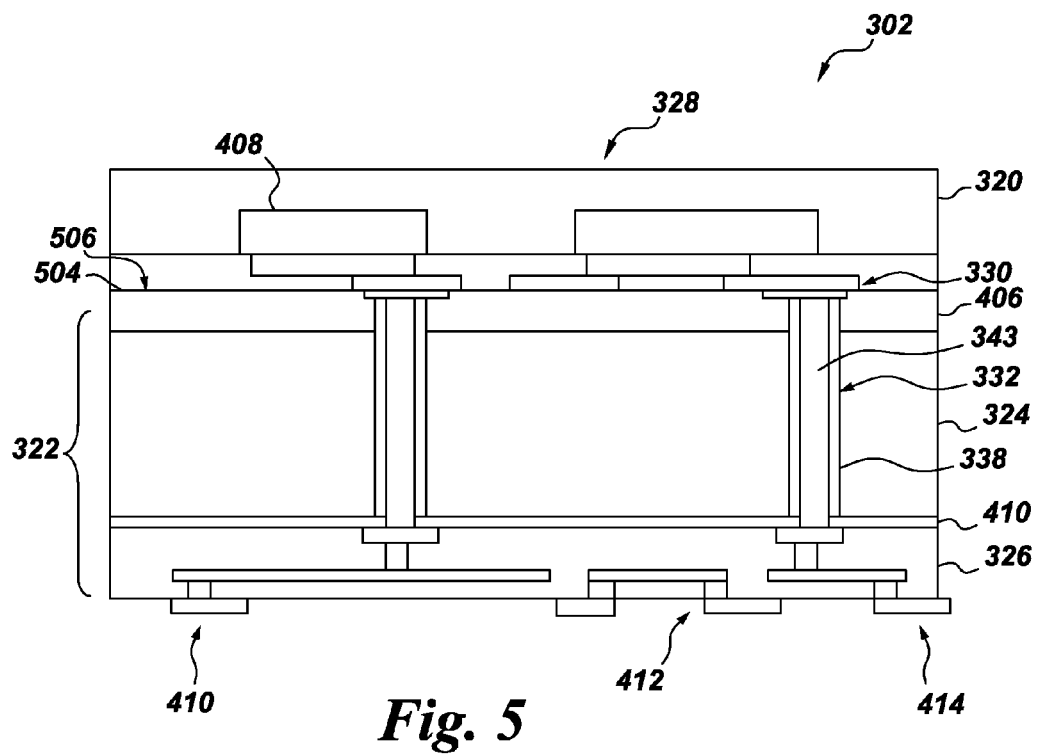
FIG. 5 is a partial view of a portion of the photodiode array shown in FIG. 3 in accordance with some embodiments of the present invention.

FIGS. 4 and 5 depict a more detailed view of the portion of the photodiode array 302 indicated at 4, 5 of FIG. 3.

In some embodiments, the passive layer 322 may comprise one or more layers. For example, referring to FIG. 4, in some embodiments, the passive layer 322 may comprise a dielectric layer 416 disposed between the interposer layer 324 and the redistribution layer 326. When present, the dielectric layer electrically isolates the interposer layer 324 and the redistribution layer 326, thereby facilitating propagation of the signal from the semiconductor layer 320 (e.g., p-type and n-type fields 408 coupled to conductive contacts 330 shown) to the redistribution layer 326 via the conductive material 342 disposed within the features 332.

In some embodiments, the interposer layer 324 may comprise a single silicon containing layer (as described above) or multiple silicon containing layers. For example, in some embodiments, the interposer layer 324 may comprise a second silicon containing layer 406, such as shown in FIG. 4. In such embodiments, the features 332 may be formed after bonding of the diode to the passive layer 322 such that the features 332 extend at least partially into a silicon oxide layer 404 of the semiconductor layer (diode) 320 utilizing, for example, a via last fabrication technique. Forming the features 332 in such a manner facilitates an oxide-to-oxide bonded interface (indicated at 402) between the silicon oxide layer 404 of the semiconductor layer 320 and the second silicon containing layer 406 of the interposer layer 324.

Alternatively, in some embodiments, the interposer layer 324 may be separately fabricated to form the features 332 utilizing, for example, a via first fabrication technique. In such embodiments, the features 332 extend to a surface 504 of the second silicon containing layer 406 thereby providing an oxide-to-oxide and metal-to-metal bonded heterogeneous interface (indicated at 506).

Thus, an improved photodiode array has been provided herein. In at least some embodiments, the inventive photodiode array reduces a number of components typically utilized in conventional photodiode array fabrication, thereby reducing fabrication cost and complexity of the photodiode array.

Ranges disclosed herein are inclusive and combinable (e.g., ranges of "5 ohm-cm and 2000 ohm-cm", is inclusive of the endpoints and all intermediate values of the ranges of "5 ohm-cm and 2000 ohm-cm," etc.). "Combination" is inclusive of blends, mixtures, alloys, reaction products, and the like. Furthermore, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the state value and has the meaning dictated by context, (e.g., includes the degree of error associated with measurement of the particular quantity). The suffix "(s)" as used herein is intended to include both the singular and the plural of the term that it modifies, thereby including one or more of that term (e.g., the colorant(s) includes one or more colorants). Reference throughout the specification to "one embodiment", "some embodiments", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A photodiode array, comprising:
a semiconductor layer configured to convert photons into analog electrical signals, wherein the semiconductor layer is a backlit diode, the backlit diode having a light receiving surface and an opposing surface and at least one of a p-type field or an n-type field formed in the opposing surface; and
a passive layer having a first surface and a second surface disposed opposite the first surface, wherein the semiconductor layer is coupled to the first surface, and wherein the passive layer is configured to have a signal receiving component coupled directly to the second surface of the passive layer.

2. The photodiode array of claim 1, wherein the backlit diode has a thickness of less than about 200 microns (μm).

3. The photodiode array of claim 1, wherein the passive layer comprises an interposer layer fabricated from at least one of silicon, silicon oxide, or glass.

4. The photodiode array of claim 3, wherein the interposer layer has a resistivity of between about 5 ohm-cm and 2000 ohm-cm.

5. The photodiode array of claim 3, wherein the interposer layer comprises a plurality of features extending from the first surface to the second surface of the interposer layer, wherein the plurality of features are filled with a conductive material to electrically couple the semiconductor layer to the signal receiving component.

6. The photodiode array of claim 5, wherein the plurality of features are through silicon vias.

7. The photodiode array of claim 3, wherein the passive layer further comprises a redistribution layer, wherein the redistribution layer forms the second surface of the passive layer.

8. The photodiode array of claim 7, wherein the redistribution layer comprises a plurality of metal containing layers separated by a plurality of dielectric layers.

9. A radiation detector for an imaging apparatus, comprising:
   a scintillator;
   a photodiode array, comprising:
      a backlit diode having a light receiving surface and an opposing surface and at least one of a p-type field or an n-type field formed in the opposing surface;
      a passive layer having a first surface and a second surface disposed opposite the first surface, wherein the backlit diode is coupled to the first surface; and
      a signal receiving component coupled to the second surface of the passive layer.

10. The radiation detector of claim 9, wherein the passive layer further comprises a redistribution layer, wherein the redistribution layer forms the second surface of the passive layer.

11. The radiation detector of claim 10, wherein the redistribution layer comprises a plurality of metal containing layers separated by a plurality of dielectric layers.

12. The radiation detector of claim 9, wherein the backlit diode has a thickness of less than about 200 microns (μm).

13. The radiation detector of claim 9, wherein the passive layer comprises an interposer layer fabricated from at least one of silicon, silicon oxide, or glass.

14. The radiation detector of claim 13, wherein the interposer layer has a resistivity of between about 5 ohm-cm and 2000 ohm-cm.

15. The radiation detector of claim 13, wherein the interposer layer comprises a plurality of features extending from the first surface to the second surface of the interposer layer, wherein the plurality of features are filled with a conductive material to electrically couple the backlit diode to the signal receiving component.

\* \* \* \* \*